US012648086B2

(12) United States Patent
Gi et al.

(10) Patent No.: US 12,648,086 B2
(45) Date of Patent: Jun. 2, 2026

(54) METHOD OF MANUFACTURING PRINTED CIRCUIT BOARD

(71) Applicant: SAMSUNG ELECTRO-MECHANICS CO., LTD., Suwon-si (KR)

(72) Inventors: Myung Ju Gi, Suwon-si (KR); Young Il Cho, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 84 days.

(21) Appl. No.: 18/809,771

(22) Filed: Aug. 20, 2024

(65) Prior Publication Data

US 2024/0414849 A1     Dec. 12, 2024

Related U.S. Application Data

(62) Division of application No. 17/850,156, filed on Jun. 27, 2022, now Pat. No. 12,101,890.

(30) Foreign Application Priority Data

Dec. 23, 2021     (KR) ........................ 10-2021-0185824

(51) Int. Cl.
*H05K 3/00*     (2006.01)
*H05K 3/18*     (2006.01)
(52) U.S. Cl.
CPC .......... *H05K 3/0017* (2013.01); *H05K 3/188* (2013.01); *H05K 2203/0323* (2013.01); *H05K 2203/163* (2013.01)

(58) Field of Classification Search
CPC ...... H05K 3/0017; H05K 3/188; H05K 3/244; H05K 3/4682; H05K 3/0011; H05K 3/10;
(Continued)

(56) References Cited

U.S. PATENT DOCUMENTS 6,803,324 B2 * 10/2004 Ogawa ................. H05K 3/4614
                                                             257/676
7,093,356 B2     8/2006 Imafuji et al.
(Continued)

FOREIGN PATENT DOCUMENTS

JP     2011-040702 A     2/2011
JP     2015-211146 A     11/2015
KR     10-2021-0026758 A     3/2021

OTHER PUBLICATIONS

Office Action issued on Aug. 25, 2025 in the corresponding Korean Patent Application No. 10-2021-0185824 with English translation.

*Primary Examiner* — Donghai D Nguyen
(74) *Attorney, Agent, or Firm* — Morgan, Lewis & Bockius LLP

(57)     ABSTRACT

A method of manufacturing a printed circuit board includes forming an intermediate layer on a first conductive layer disposed on a first insulating layer, forming a second conductive layer and a second insulating layer on the intermediate layer, separating the first insulating layer from at least one portion of the first conductive layer, and etching the first conductive layer and the intermediate layer. After the etching, a surface of the second conductive layer protrudes further than a surface of the second insulating layer. The intermediate layer before the etching includes a portion overlapping the second conductive layer in a vertical direction and another portion not overlapping the second conductive layer in the vertical direction.

17 Claims, 18 Drawing Sheets

(58) Field of Classification Search
   CPC .......... H05K 3/4655; H05K 3/06; H05K 1/09;
                H05K 2203/163; H05K 2203/1536; Y10T
                                                 29/49156
   See application file for complete search history.

(56)                    References Cited

U.S. PATENT DOCUMENTS

|  |  |  |  |
|---|---|---|---|
| 7,303,978 B2 * | 12/2007 | Ito | ..................... H01L 23/49816 |
|  |  |  | 438/614 |
| 7,346,982 B2 | 3/2008 | Kim et al. | |
| 8,015,700 B2 | 9/2011 | Nakamura et al. | |
| 8,959,758 B2 | 2/2015 | Arai et al. | |
| 10,249,561 B2 * | 4/2019 | Ishihara | ............ H01L 23/49816 |
| 2010/0132997 A1 | 6/2010 | Hando | |
| 2011/0042128 A1 | 2/2011 | Hsu | |
| 2012/0241206 A1 | 9/2012 | Arai et al. | |
| 2021/0066210 A1 | 3/2021 | Oh et al. | |

* cited by examiner

115

131
132
113

111

125
131
132
113

111

141
112
121
123
125
131
132
113
111

METHOD OF MANUFACTURING PRINTED CIRCUIT BOARD

CROSS-REFERENCE TO RELATED APPLICATIONS

This application is the divisional application of U.S. patent application Ser. No. 17/850,156 filed on Jun. 27, 2022, which claims benefit of priority to Korean Patent Application No. 10-2021-0185824 filed on Dec. 23, 2021 in the Korean Intellectual Property Office, the disclosures of which are incorporated herein by references in its entirety.

TECHNICAL FIELD

The present disclosure relates to a method of manufacturing a printed circuit board.

BACKGROUND

In accordance with high performance and/or hyper-integration density of electronic devices or electric devices in which a printed circuit board is used, the size of each component of a printed circuit board has also gradually decreased. As a printed circuit board or each component of a printed circuit board is highly integrated and/or miniaturized, it may be difficult to secure reliability of a printed circuit board.

SUMMARY

An aspect of the present disclosure is to provide a method of manufacturing a printed circuit board.

According to an aspect of the present disclosure, a method of manufacturing a printed circuit board includes forming an intermediate layer on a first conductive layer disposed on a first insulating layer; forming a second conductive layer and a second insulating layer on the intermediate layer; separating the first insulating layer from at least one portion of the first conductive layer; and etching the first conductive layer and the intermediate layer, wherein, after the etching, a surface of the second conductive layer protrudes further than a surface of the second insulating layer, and wherein the intermediate layer before the etching includes a portion overlapping the second conductive layer in a vertical direction and another portion not overlapping the second conductive layer in the vertical direction.

According to another aspect of the present disclosure, a method of manufacturing a printed circuit board includes forming an intermediate layer on a first conductive layer disposed on a first insulating layer; forming second conductive patterns, including a metal different from a metal included in the intermediate layer, on the intermediate layer, wherein the intermediate layer extends between adjacent patterns of the second conductive patterns; forming a second insulating layer on the intermediate layer to cover the second conductive patterns; and removing the first insulating layer, the first conductive layer, and the intermediate layer, so as to form the printed circuit board including the second conductive patterns at least partially embedded in the second insulating layer.

BRIEF DESCRIPTION OF DRAWINGS

The above and other aspects, features, and advantages of the present disclosure will be more clearly understood from the following detailed description, taken in conjunction with the accompanying drawings, in which:

FIGS. 2A to 2M are diagrams illustrating a process of manufacturing a printed circuit board in which a difference in thicknesses between one portion and the other portion of an intermediate layer is implemented in accordance with a method of manufacturing a printed circuit board according to an example embodiment of the present disclosure, viewed from the side;

DETAILED DESCRIPTION

Hereinafter, embodiments of the present disclosure will be described as follows with reference to the attached drawings.

These embodiments are described in sufficient detail to enable those skilled in the art to practice the invention. It is to be understood that the various embodiments of the invention, although different, are not necessarily mutually exclusive. For example, structures, shapes, and sizes described as examples in embodiments in the present disclosure may be implemented in another example embodiment without departing from the spirit and scope of the present disclosure. Further, modifications of positions or arrangements of elements in example embodiments may be made without departing from the spirit and scope of the present disclosure. The following detailed description is, accordingly, not to be taken in a limiting sense, and the scope of the present invention are defined only by appended claims, appropriately interpreted, along with the full range of equivalents to which the claims are entitled.

FIGS. 1A to 1L are diagrams illustrating a process of manufacturing a printed circuit board in accordance with a method of manufacturing a printed circuit board according to an example embodiment.

Figure 1A:
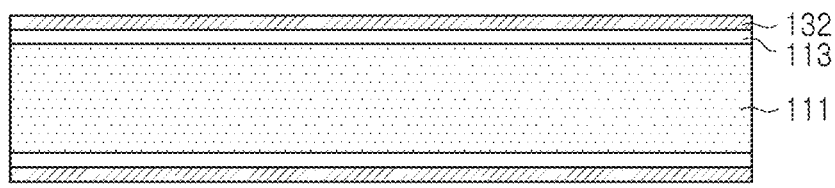
FIGS. 1A to 1L are diagrams illustrating a process of manufacturing a printed circuit board in accordance with a method of manufacturing a printed circuit board according to an example embodiment of the present disclosure, viewed from the side.
Figure 1B:
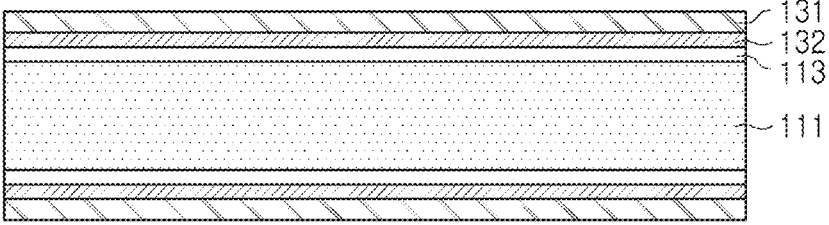

Referring to FIGS. 1A and 1B, the method of manufacturing a printed circuit board in an example embodiment may include forming an intermediate layer 131 on a first conductive layer 132 on a first insulating layer 111.

For example, the combination structure of the first insulating layer 111 and the first conductive layer 132 may be a copper clad laminate (CCL). For example, the adhesive layer 113 may allow the first insulating layer 111 and the first conductive layer 132 to adhere to each other, and the structure of the combination of the first insulating layer 111, the adhesive layer 113, and the first conductive layer 132 may be manufactured by a detachable copper foil (DCF) manufacturing method. For example, the adhesive layer 113 may be a foam tape, and the first conductive layer 132 may include copper (Cu).

Referring to FIGS. 1C to 1G, the method of manufacturing a printed circuit board in an example embodiment may include forming a second conductive layer 125 and a second insulating layer 112 on the intermediate layer 131 to cover the second conductive layer 125.

For example, the forming the intermediate layer 131 may be performed according to a nickel (Ni) plating process. For example, the second conductive layer 125 may include copper (Cu) and may be formed according to a copper (Cu) plating process.

Figure 1C:
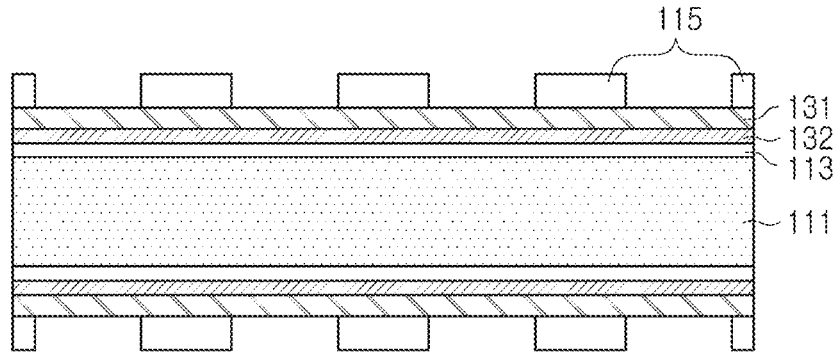
Figure 1D:
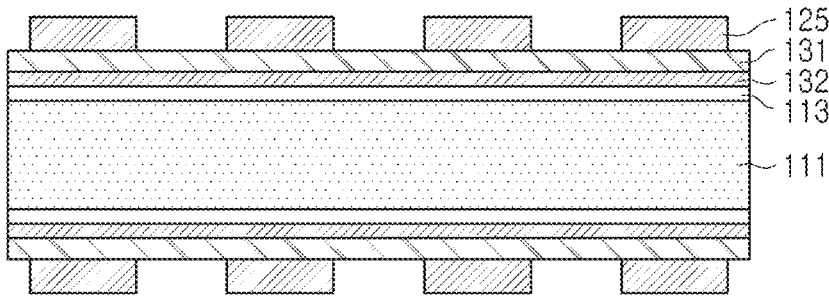
Figure 1E:
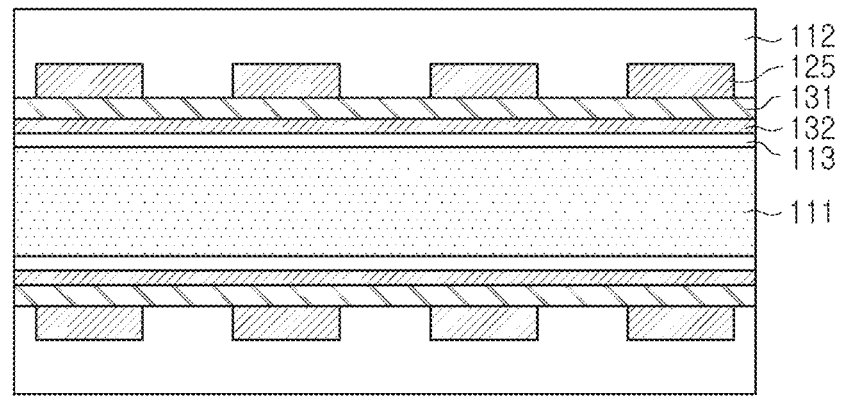
Figure 1F:
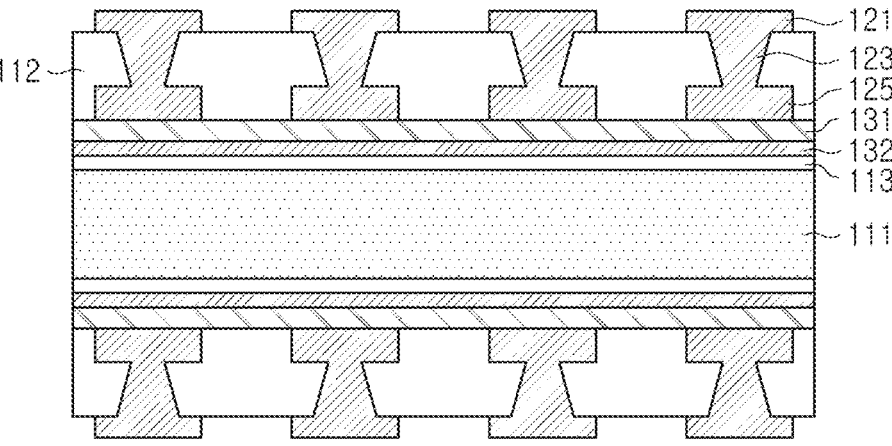
Figure 1G:
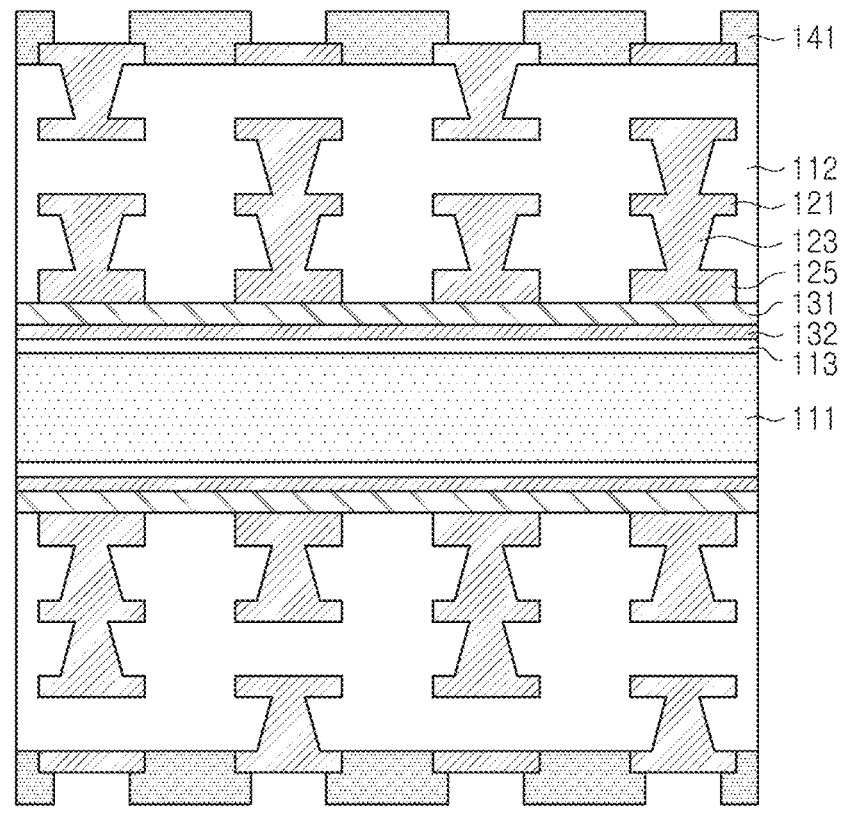
Figure 1H:
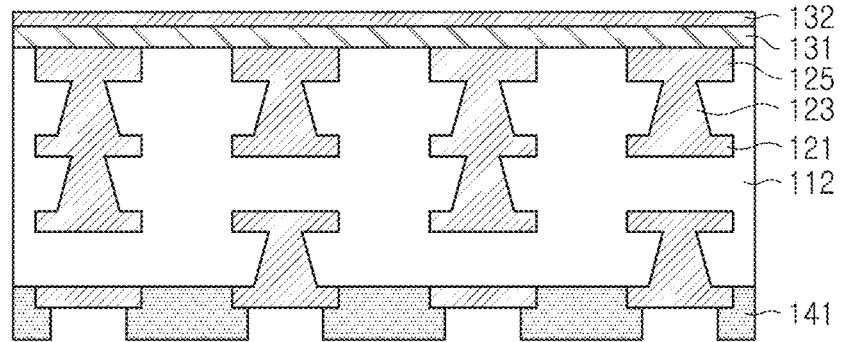

Referring to FIG. 1H, the method of manufacturing a printed circuit board in an example embodiment may include separating the first insulating layer 111 from at least one portion of the first conductive layer 132. That is, a printed circuit board manufactured according to the method of manufacturing a printed circuit board in an example embodiment may have a coreless structure. For example, the size (e.g., a width and thickness) of the second conductive layer 125 may be relatively small, and the total number of stacks of the printed circuit board may be relatively small.

For example, the adhesive layer 113 adhered between the first insulating layer 111 and the first conductive layer 132 may be separated from at least one of the first insulating layer 111 and the first conductive layer 132.

Figure 1I:
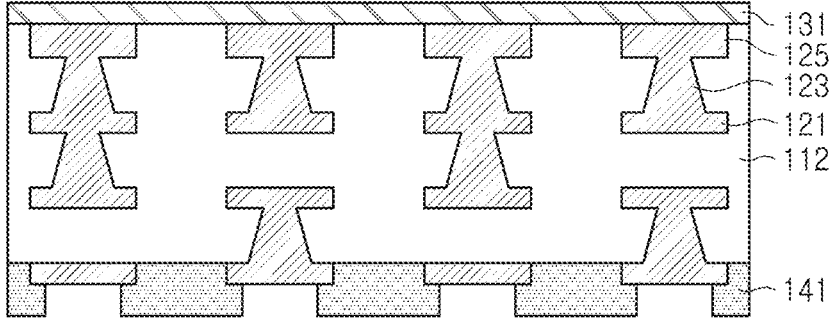
Figure 1J:
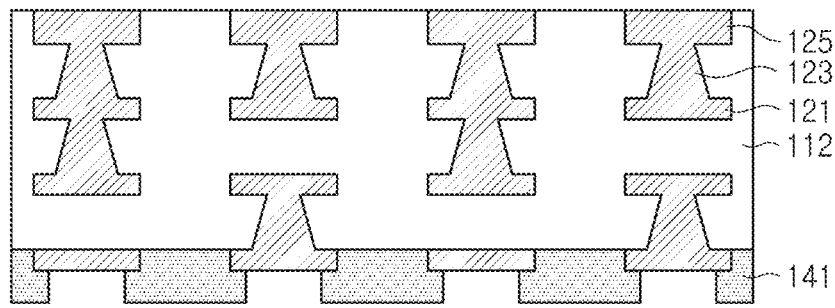
Figure 1K:
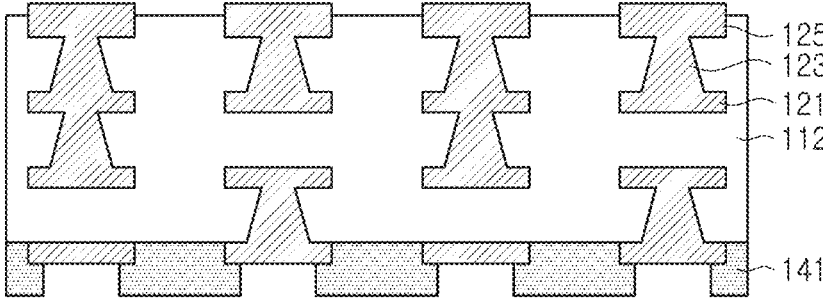

Referring to FIGS. 1I to 1K, the method of manufacturing a printed circuit board in an example embodiment may include etching the first conductive layer 132 and the intermediate layer 131. For example, the etching may include etching one of a metal material and an insulating material using an etching liquid or an etching gas reacting to the one of the metal material and the insulating material and leaving the other.

Since the intermediate layer 131 is disposed between the first conductive layer 132 and the second conductive layer 125, the intermediate layer 131 may prevent the second conductive layer 125 from being etched while the first conductive layer 132 is etched.

Figure 1L:
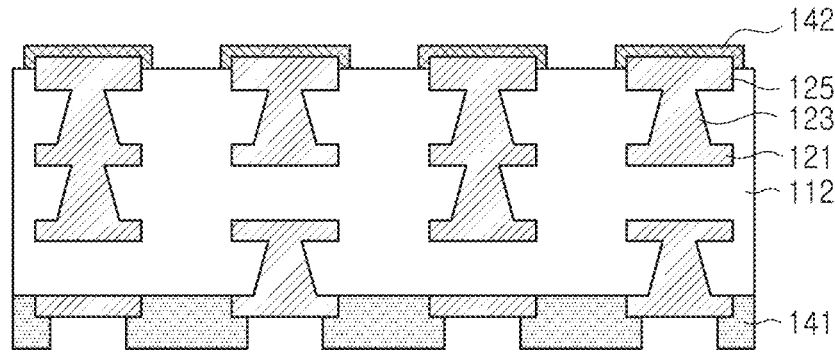

Referring to FIGS. 1K and 1L, after the etching, the surface (e.g., the upper surface) of the second conductive layer 125 facing the intermediate layer 131 may protrude further than the surface (e.g., the upper surface) of the second insulating layer 112 facing the intermediate layer 131.

The second conductive layer 125 may be electrically connected to a component (e.g., an integrated circuit, or a passive component) disposed on the second conductive layer 125. For example, the second conductive layer 125 may include a plurality of portions spaced apart from each other, and may be a pad or land of a printed circuit board.

Since the second conductive layer 125 protrudes upwardly, the second conductive layer 125 may be electrically connected to the component without solder including a material having a low melting point (e.g., a Pb-based material, an Sn-based material). Also, the size (e.g., a width and thickness) of the second conductive layer 125 may be reduced efficiently, and the number of a plurality of portions of the second conductive layer 125 per unit area may increase efficiently, such that the second conductive layer 125 may be advantageous for high integration and/or miniaturization of the component.

Referring to FIGS. 1B to 1I, the intermediate layer 131 before the etching may include a portion overlapping the second conductive layer 125 in a vertical direction and the other portion not overlapping the second conductive layer 125 in the vertical direction.

When the intermediate layer 131 does not include a portion not overlapping the second conductive layer 125 in the vertical direction, the difference between a design and an actual design of a portion of the intermediate layer 131 may cause a point at which the intermediate layer 131 may not prevent the second conductive layer 125 from being etched, and may act as a limitation in reliability of the intermediate layer 131. For example, when a point of the second conductive layer 125 is etched while the first conductive layer 132 is etched, the electrical connection relationship of a point of the second conductive layer 125 with respect to the component may change. Alternatively, the physical structure of one point of the second conductive layer 125 may become unstable, and crevices or voids may be formed due to instability of the positional relationship between the second conductive layer 125 and the second insulating layer 112. The importance of overcoming the limitation in reliability limit may be higher when the second conductive layer 125 has a structure protruding upwardly, and when the size (e.g., a width and thickness) of the second conductive layer 125 is relatively small or the number of divided portions in unit area increases.

When the intermediate layer 131 includes a portion overlapping the second conductive layer 125 in the vertical direction and another portion not overlapping the second conductive layer 125 in the vertical direction, the intermediate layer 131 may be implemented as a single panel, and a point at which the intermediate layer 131 may not prevent the second conductive layer 125 from being etched may be prevented in advance. Accordingly, reliability of the structure in which the second conductive layer 125 protrudes upwardly may increase, and high integration and/or miniaturization of the second conductive layer 125 may be implemented efficiently.

For example, referring to FIGS. 1A and 1B, the forming the intermediate layer 131 may include forming at least one portion of the intermediate layer 131 in a state in which a protective pattern is not formed on the first conductive layer 132. Accordingly, the intermediate layer 131 may be manufactured as a single panel.

For example, referring to FIGS. 1C and 1D, the protective pattern 115 may be disposed on a portion of the intermediate layer 131, and the second conductive layer 125 may be formed on another portion of the intermediate layer 131 where the protective pattern 115 is not formed. For example, the protective pattern 115 may be a photosensitive film, and may be removed after the second conductive layer 125 is formed.

For example, referring to FIGS. 1E and 1F, a portion of the second insulating layer 112 may be formed after the second conductive layer 125 is formed, and the interlayer via 123 penetrating a portion of the insulating layer 112 may be formed. For example, the conductive pattern 121 may be formed between a portion and another portion of the second insulating layer 112, and may be connected to the interlayer via 123. The interlayer via 123 may also be connected to the second conductive layer 125. For example, the interlayer via 123 may be formed as a metal material is filled in a hole formed by a laser and/or a drill.

By repeating the processes described with reference to FIGS. 1E and 1F, a structure shown in FIG. 1G (not including the surface layer 141) may be formed.

For example, referring to FIG. 1G, a surface layer 141 may be formed on the second insulating layer 112, and a portion of the surface layer 141 may be penetrated. For example, the penetrated portion of the surface layer 141 may be an electrical connection path between the second conductive layer 125 and an additional substrate (or an additional component). For example, the surface layer 141 may be a solder resist.

For example, referring to FIG. 1H, the first insulating layer 111 may be removed from at least one portion of the first conductive layer 132.

For example, referring to FIG. 1I, the first conductive layer 132 may be removed from the intermediate layer 131.

For example, referring to FIG. 1J, the intermediate layer 131 may be removed from the second insulating layer 112 by an etching process.

For example, referring to FIG. 1K, the etching may further include etching a portion of the second insulating layer 112. Accordingly, the second conductive layer 125 may further protrude upwardly from a level of the upper surface of the second insulating layer 112. For example, the portion of the second insulating layer 112 including the surface (e.g., an upper surface) facing the intermediate layer 131 may include an Ajinomoto build-up film (ABF). Accordingly, the second insulating layer 112 may stably secure a positional relationship with respect to the second conductive layer 125 having a smaller size in accordance with high integration and/or miniaturization. For example, the upper surface of the second insulating layer 112 which is partially etched may go through a cleaning process.

For example, referring to FIG. 1L, the method of manufacturing a printed circuit board in an example embodiment may further include performing a surface treatment on the surface (e.g., the upper surface) of the second conductive layer 125 facing the intermediate layer 131 after the etching. Accordingly, a surface treatment layer 142 may be formed, and the upper protruding structure of the second conductive layer 125 may be less affected from external elements (e.g., air) of the printed circuit board (e.g., corrosion due to chemical reaction, or the like).

For example, the surface treatment layer 142 may be at least one portion of an electroless nickel electroless palladium immersion gold (ENEPIG) structure. When reliability of the second conductive layer 125 is secured, the possibility that a variable in the process of forming the surface treatment layer 142 may act as a variable in the formation of the second conductive layer 125 may also be reduced. The surface treatment layer 142 is not limited to the ENEPIG structure, and may be implemented as an organic solder passivation (OSP) layer in example embodiments.

FIGS. 2A to 2M are diagrams illustrating a process of manufacturing a printed circuit board in which a difference in thicknesses between one portion and the other portion of an intermediate layer is implemented in accordance with a method of manufacturing a printed circuit board according to an example embodiment.

The descriptions not described with respect to FIGS. 2A to 2M may be the same as the descriptions of the aforementioned example embodiment described with respect to FIGS. 1A to 11L.

Referring to FIGS. 2A to 2D, the method of manufacturing a printed circuit board in an example embodiment may include forming the intermediate layer 131 on the first conductive layer 132 on the first insulating layer 111.

Referring to FIGS. 2E to 21, the method of manufacturing a printed circuit board in an example embodiment may include forming a second conductive layer 125 and a second insulating layer 112 on the intermediate layer 131.

Figure 2A:
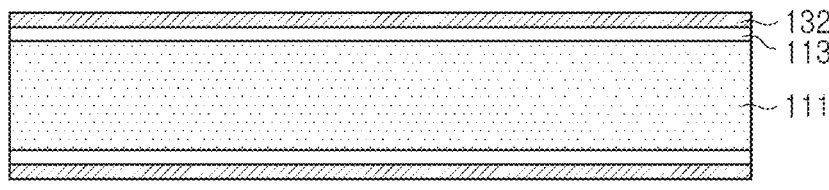
Figure 2B:
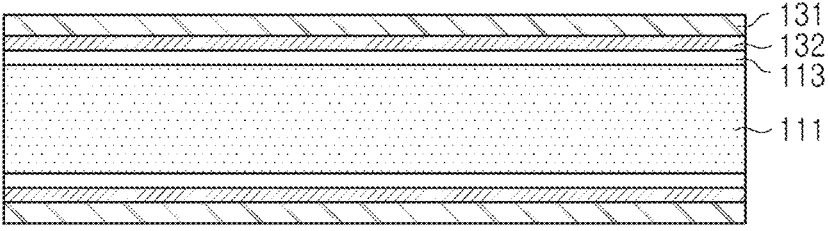
Figure 2C:
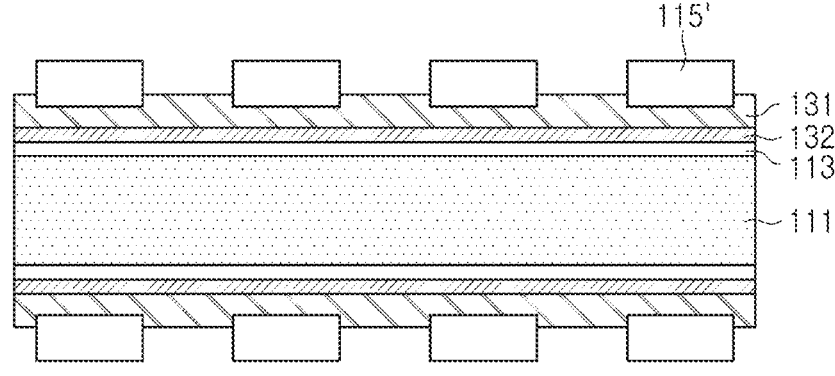
Figure 2D:
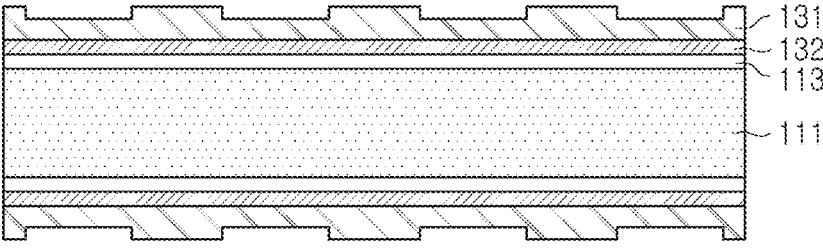
Figure 2E:
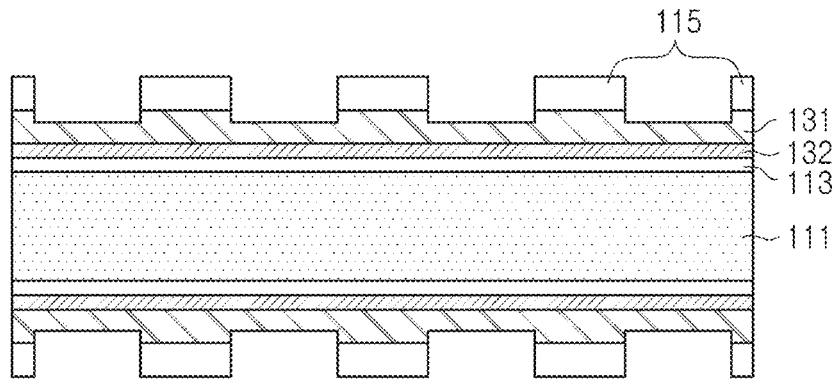
Figure 2F:
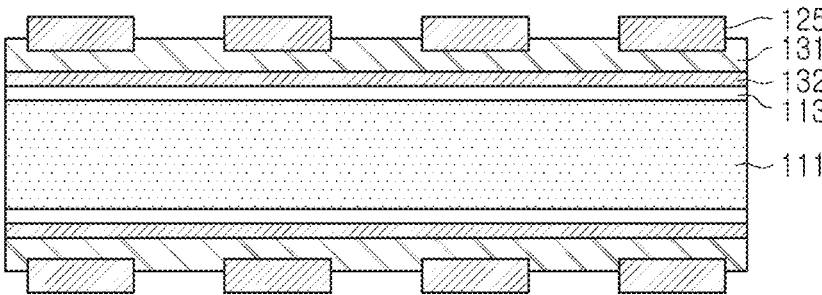
Figure 2G:
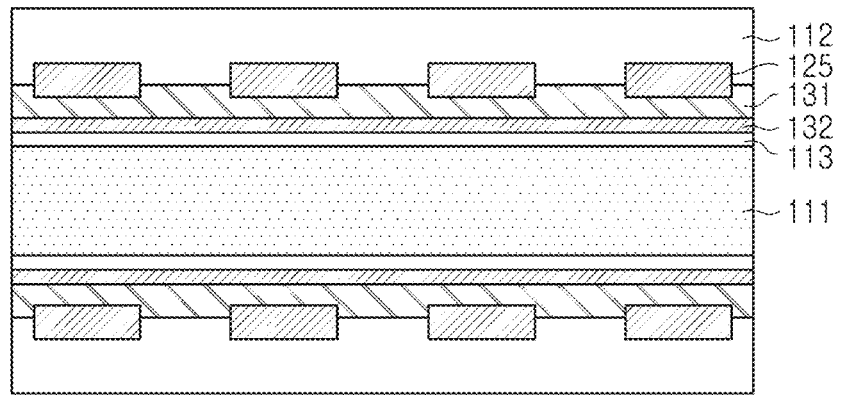
Figure 2H:
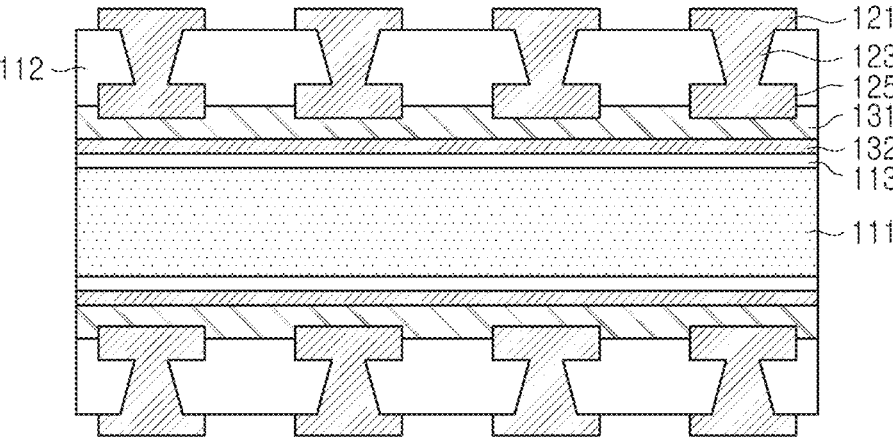
Figure 21:
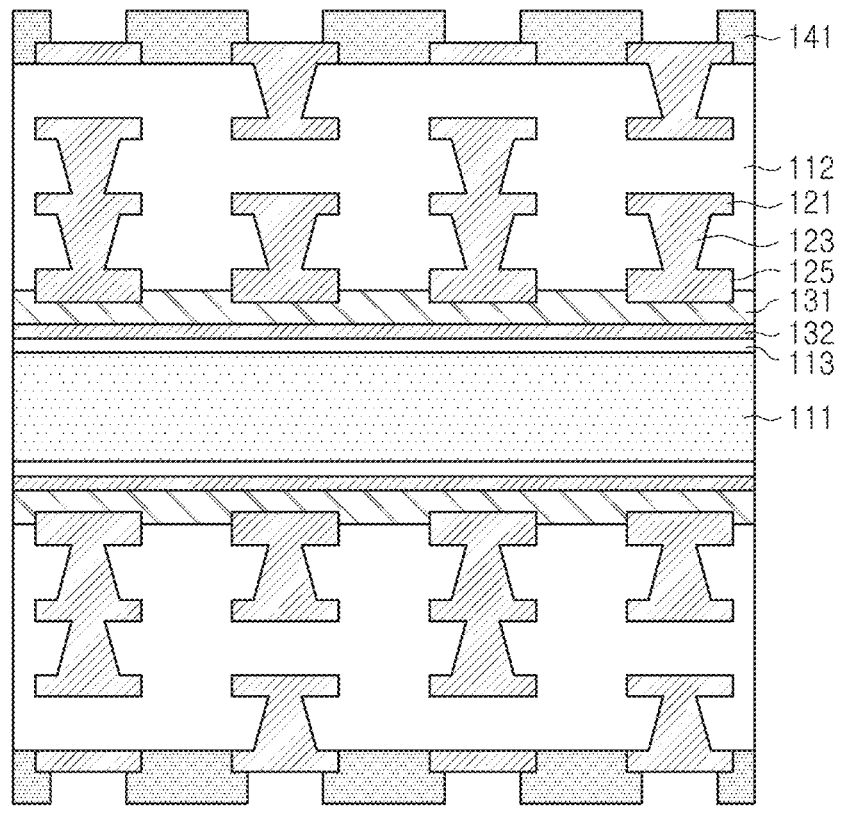
Figure 2J:
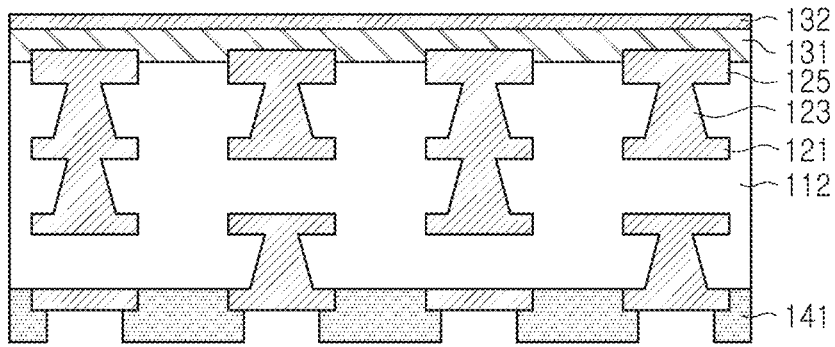

Referring to FIG. 2J, the method of manufacturing a printed circuit board in an example embodiment may include separating the first insulating layer 111 from at least one portion of the first conductive layer 132.

Figure 2K:
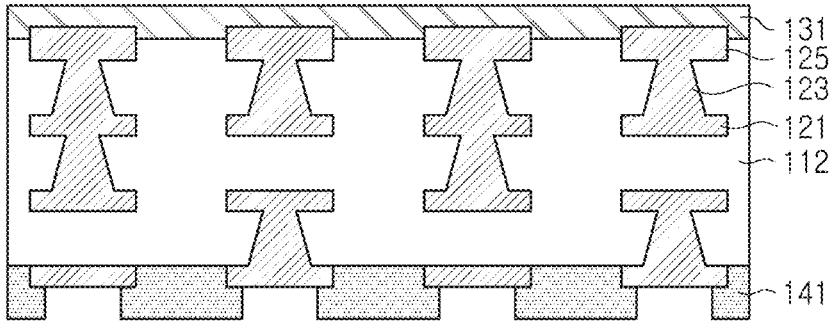
Figure 2L:
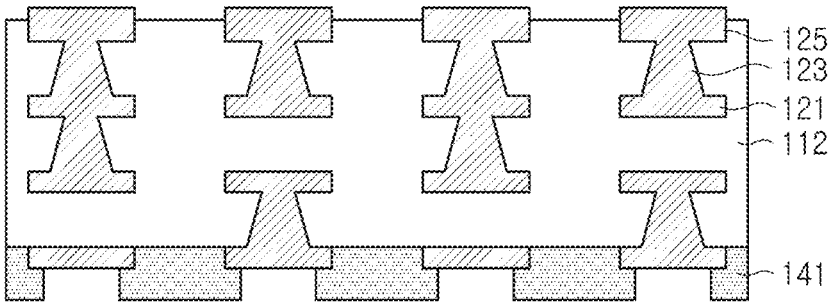

Referring to FIGS. 2K to 2L, the method of manufacturing a printed circuit board in an example embodiment may include etching the first conductive layer 132 and the intermediate layer 131.

Figure 2M:
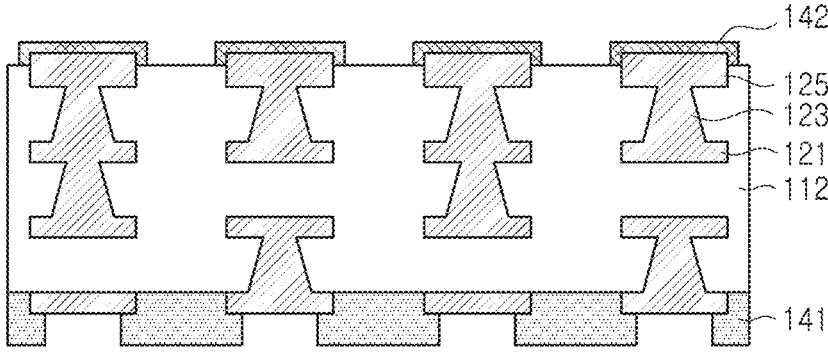

Referring to FIGS. 2L and 2M, after the etching, the surface (e.g., the upper surface) of the second conductive layer 125 facing the intermediate layer 131 may protrude further than the surface (e.g., the upper surface) of the second insulating layer 112 facing the intermediate layer 131.

Referring to FIGS. 2B to 2K, the intermediate layer 131 before the etching may include a portion overlapping the second conductive layer 125 in the vertical direction and the other portion not overlapping the second conductive layer 125 in the vertical direction.

Referring to FIGS. 2C to 2K, a thickness of a portion of the intermediate layer 131 overlapping the second conductive layer 125 in the vertical direction before the etching may be less than a thickness of the other portion of the intermediate layer 131 not overlapping the conductive layer 125 in the vertical direction.

Accordingly, without the etching a portion of the second insulating layer 112 in FIGS. 1J and 1K, the second conductive layer 125 may further protrude upwardly from the level of the upper surface of the second insulating layer 112. Accordingly, the positional relationship between the second conductive layer 125 and the second insulating layer 112 may become stable, reliability of the second conductive layer 125 may increase, and efficiency of high integration and miniaturization of the second conductive layer 125 may increase.

For example, referring to FIGS. 2A and 2B, the intermediate layer 131 may be formed on the first conductive layer 132 on the first insulating layer 111.

For example, referring to FIGS. 2B to 2D, the forming the intermediate layer may include forming a protective pattern 115' on at least one portion of the intermediate layer 131 in a state in which a portion of the intermediate layer 131 is formed on the first conductive layer 132, and forming the other portion of the intermediate layer 131 on the region in which the protective pattern 115' is not formed. In this case, regions where the protective pattern 115' is formed may have a thinner layer of the intermediate layer 131, as compared to regions where the protective pattern 115' is not formed, because the additional formation of the intermediate layer 131 after forming the protective pattern 115' shown in FIG. 2C is performed to the regions where the protective pattern 115' is not formed. Then, the protective pattern 115' may be removed. Accordingly, a difference in thicknesses between a portion of the intermediate layer 131 and another portion may be formed, as shown in FIG. 2D.

For example, referring to FIGS. 2D and 2E, the forming the second conductive layer 125 and the second insulating layer 112 may include forming a protective pattern 115 on another portion of the intermediate layer 131 which is relative thicker and forming the second conductive layer 125 in a region in which the second protective pattern 115 is not formed. Thereafter, the protection pattern 115 may be removed.

The first and second insulating layers 111 and 112 are not limited to copper clad laminates (CCL) and ABF, and may be prepreg, FR-4, bismaleimide triazine (BT), photo-imagable dielectric (PID) resin, and may be at least one of a material selected from a group consisting of thermosetting resin such as epoxy resin, thermoplastic resin such as polyimide, polytetrafluoroethylene (PTFE), glass-based resin and ceramic-based resin (e.g., low temperature co-fired ceramic (LTCC)). A material included in the first and second conductive layers 132 and 125 are not limited to copper (Cu), and may be at least one of silver (Ag), palladium (Pd), aluminum (Al), nickel (Ni), or titanium (Ti), gold (Au), and platinum (Pt). For example, the first and second conductive layers 132 and 125 may be implemented using a semi-additive process (SAP), a modified semi-additive process (MSAP), or a subtractive method.

Figure 3A:
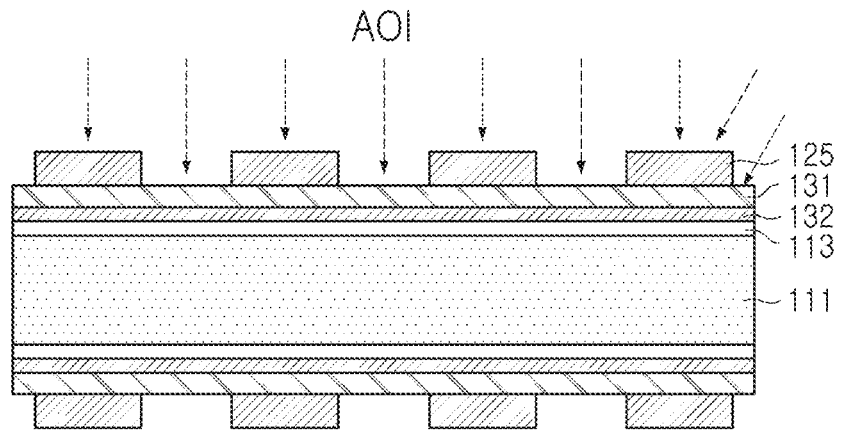
FIGS. 3A and 3B are diagrams illustrating a process of inspecting a second conductive layer while the printed circuit board in FIGS. 1D and 2F is manufactured, viewed from the side.
Figure 3B:
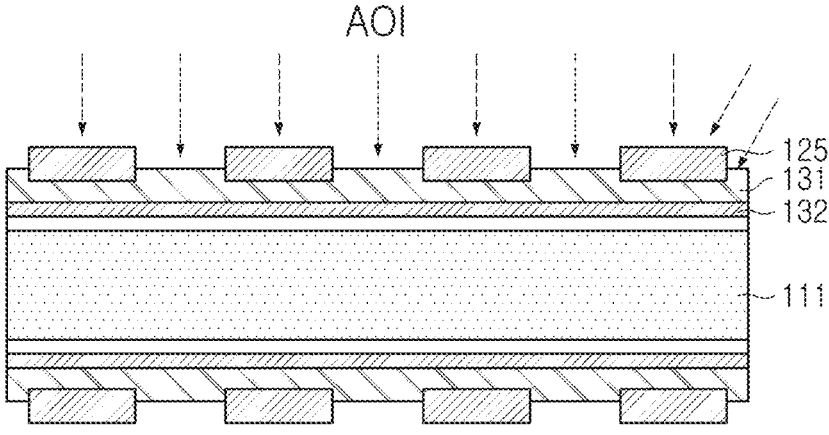
Figure 3C:
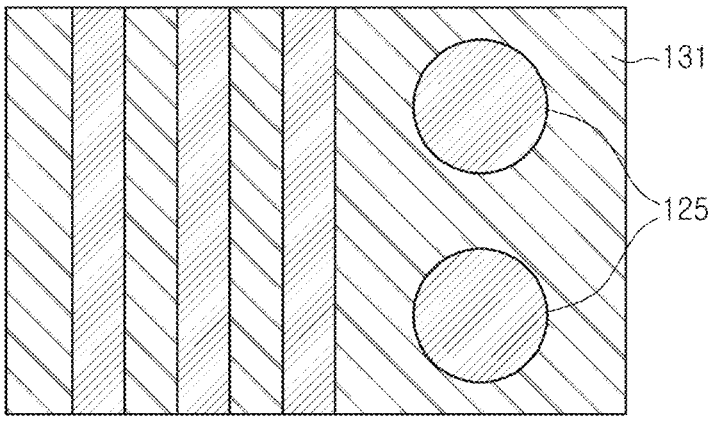
FIG. 3C is a plan diagram illustrating an intermediate process of manufacturing the printed circuit board in FIGS. 1D and 2F.

FIGS. 3A and 3B are diagrams illustrating a process of inspecting a second conductive layer while the printed circuit board in FIGS. 1D and 2F is manufactured, viewed from the side. FIG. 3C is a plan diagram illustrating an intermediate process of manufacturing the printed circuit board in FIGS. 1D and 2F.

Referring to FIGS. 3A to 3C, the forming the second conductive layer 125 and the second insulating layer of the method of manufacturing a printed circuit board in an example embodiment may further include inspecting whether the second conductive layer 125 is formed in each of a plurality of positions on the intermediate layer 131 while the second conductive layer 125 is formed and the second insulating layer is not formed.

For example, the inspecting may be implemented by an automated optical inspection (AOI), and the type of light (e.g., visible light, infrared light, ultraviolet light, X-ray) used in the AOI may be appropriately determined to discriminate a difference between the metal material (e.g., nickel) of the intermediate layer 131 and the metal material (e.g., copper) of the second conductive layer 125 or to identify a difference in roughness depending on the difference of the metal materials.

When the intermediate layer 131 does not include a portion not overlapping the second conductive layer 125 in the vertical direction, the intermediate layer 131 may not be exposed upwardly, such that the AOI may not be able to performed. As for the method of manufacturing a printed circuit board in an example embodiment, the intermediate layer 131 may include both a portion overlapping the second conductive layer 125 in the vertical direction and a portion not overlapping the second conductive layer 125, such that an environment in which whether the second conductive layer 125 is defective may be detected relatively early may be provided, and process efficiency of the printed circuit board may improve.

Figure 4:
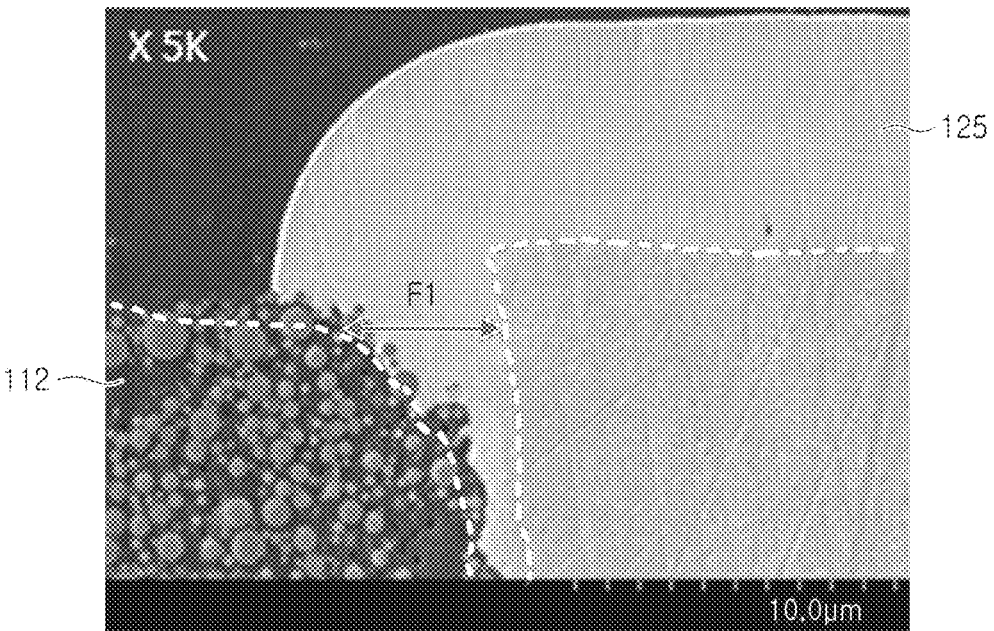
FIG. 4 is an image indicating a stable dispositional relationship between a second conductive layer and a second insulating layer of a printed circuit board manufactured in accordance with a method of manufacturing a printed circuit board according to an example embodiment of the present disclosure.

FIG. 4 is an image indicating a stable dispositional relationship between a second conductive layer and a second insulating layer of a printed circuit board manufactured accordance with a method of manufacturing a printed circuit board according to an example embodiment.

Referring to FIG. 4, the second conductive layer 125 having reliability according to the method of manufacturing a printed circuit board in an example embodiment may also have positional stability with respect to the second insulating layer 112, and interactive force F1 between the second conductive layer 125 and the second insulating layer 112 may also be balanced in the entire adjacent area of the second conductive layer 125 and the second insulating layer 112. Accordingly, the possibility of crevices or voids between the second conductive layer 125 and the second insulating layer 112 may be reduced.

Figure 5A:
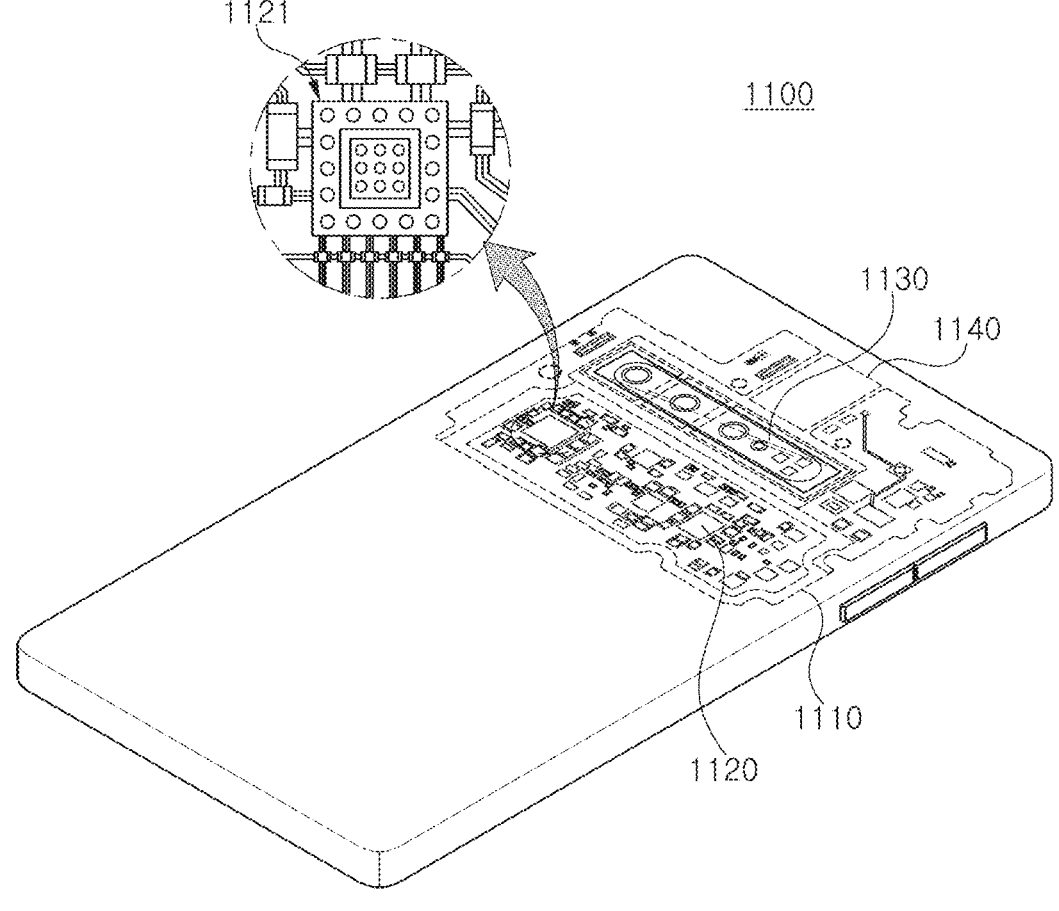
FIG. 5A is a diagram illustrating a structure of an electronic device in which a printed circuit board may be disposed according to an example embodiment of the present disclosure.
Figure 5B:
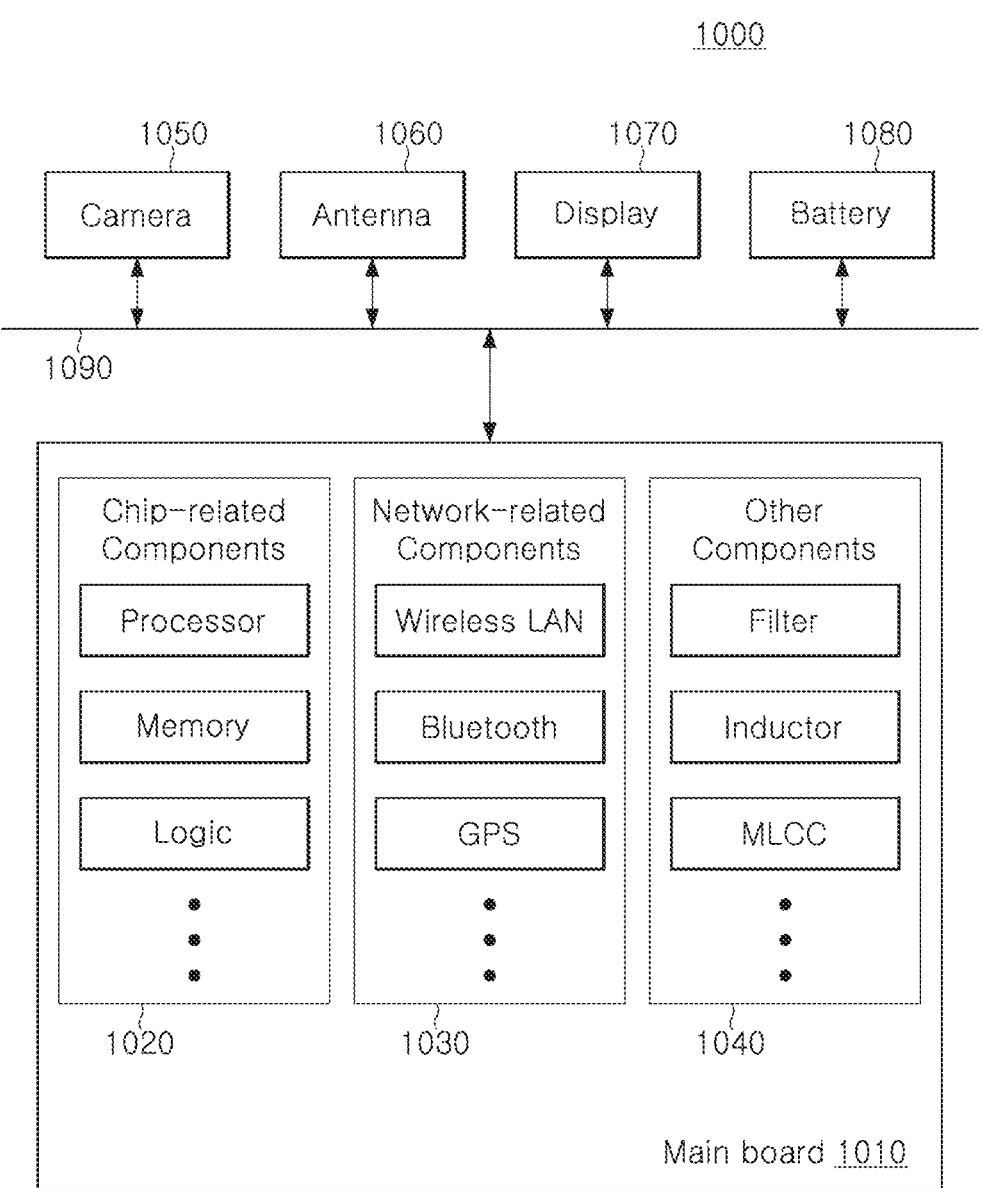
FIG. 5B is a diagram illustrating a system of an electronic device in which a printed circuit board may be disposed according to an example embodiment of the present disclosure.

FIG. 5A is a diagram illustrating a structure of an electronic device in which a printed circuit board may be disposed according to an example embodiment. FIG. 5B is a diagram illustrating a system of an electronic device in which a printed circuit board may be disposed according to an example embodiment.

Referring to FIGS. 5A and 5B, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal wirings 1090.

The chip related components 1020 may include a memory chip such as a volatile memory (for example, a dynamic random access memory (DRAM)), a non-volatile memory (for example, a read only memory (ROM)), a flash memory, or the like;

an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. Also to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

The electronic device may be implemented by a smartphone 1100. A motherboard 1110 may be accommodated in a smartphone 1100, and various electronic components 1120 may be physically or electrically connected to the motherboard 1110. Also the other components which may or may not be electrically connected to the motherboard 1110, such as the camera module 1130 and/or the speaker 1140, may be accommodated therein. A portion of the components 1120 may be the chip related components, such as a component package 1121, for example, but an example embodiment thereof is not limited thereto. The component package 1121 may be configured as a printed circuit board on which electronic components including active components and/or passive components are surface-mounted. Alternatively, the component package 1121 may be configured as a printed circuit board in which active and/or passive components are embedded. The electronic device is not necessarily limited to the smart phone 1100, and may be another electronic device as described above. A printed circuit board having a smaller size, disposed on the motherboard 1110, or the motherboard 1110 may be the printed circuit board according to an example embodiment of the present disclosure, but an example embodiment thereof is not limited thereto.

According to the aforementioned example embodiments, a printed circuit board manufactured according to the method of manufacturing a printed circuit board may increase reliability of a connection structure for components, or may be advantageous for high integration and/or miniaturization of the connection structure.

While the example embodiments have been illustrated and described above, it will be apparent to those skilled in the art that modifications and variations could be made without departing from the scope of the present invention as defined by the appended claims.

What is claimed is:

1. A method of manufacturing a printed circuit board, the method comprising:

forming an intermediate layer on a first conductive layer disposed on a first insulating layer;

forming a second conductive layer and a second insulating layer on the intermediate layer to form a stacked structure;

separating the first insulating layer from at least one portion of the first conductive layer; and etching the first conductive layer and the intermediate layer, wherein before the separating, the second conductive layer entirely protrudes from the intermediate layer in a cross-section of the stacked structure, wherein after the etching, a surface of the second conductive layer protrudes further than a surface of the second insulating layer, and wherein the intermediate layer before the etching includes one portion overlapping the second conductive layer in a vertical direction and the other portion not overlapping the second conductive layer in the vertical direction.

2. The method of claim 1, wherein the etching further includes etching a portion of the second insulating layer.

3. The method of claim 1, wherein the surface of the second insulating layer includes an Ajinomoto build-up film (ABF).

4. The method of claim 1, wherein a thickness of the one portion of the intermediate layer overlapping the second conductive layer in the vertical direction before the etching is less than a thickness of the other portion of the intermediate layer not overlapping the second conductive layer in the vertical direction before the etching.

5. The method of claim 4, wherein the forming the intermediate layer includes:

forming a first protective pattern on a portion of the intermediate layer in a state in which the portion of the intermediate layer is formed on the first conductive layer;

forming another portion of the intermediate layer in a region in which the first protective pattern is not formed; and removing the first protective pattern.

6. The method of claim 5, wherein the forming the intermediate layer includes forming a portion of the intermediate layer in a state in which the first protective pattern is not formed on the first conductive layer, and wherein the forming the second conductive layer and the second insulating layer includes forming a second protective pattern on another portion of the intermediate layer and forming the second conductive layer in a region in which the second protective pattern is not formed.

7. The method of claim 4, wherein the forming the intermediate layer is performed according to a nickel (Ni) plating process.

8. The method of claim 4, wherein each of the first conductive layer and the second conductive layer includes copper (Cu).

9. The method of claim 4, further comprising: during the forming the second conductive layer and the second insulating layer, inspecting whether the second conductive layer is formed in each of a plurality of positions on the intermediate layer in a state in which the second conductive layer is formed and the second insulating layer is not formed.

10. The method of claim 4, wherein the separating the first insulating layer from at least one portion of the first conductive layer includes separating at least one of the first insulating layer and the first conductive layer from an adhesive layer adhered between the first insulating layer and the first conductive layer.

11. The method of claim 4, further comprising performing a surface-treatment on the surface of the second conductive layer after the etching.

12. The method of claim 1, wherein the forming the intermediate layer includes forming at least one portion of the intermediate layer in a state in which a protective pattern is not formed on the first conductive layer.

13. The method of claim 1, wherein the forming the intermediate layer is performed according to a nickel (Ni) plating process.

14. The method of claim 1, wherein each of the first conductive layer and the second conductive layer includes copper (Cu).

15. The method of claim 1, further comprising: during the forming the second conductive layer and the second insulating layer, inspecting whether the second conductive layer is formed in each of a plurality of positions on the intermediate layer in a state in which the second conductive layer is formed and the second insulating layer is not formed.

16. The method of claim 1, wherein the separating the first insulating layer from at least one portion of the first conductive layer includes separating at least one of the first insulating layer and the first conductive layer from an adhesive layer adhered between the first insulating layer and the first conductive layer.

17. The method of claim 1, further comprising performing a surface-treatment on the surface of the second conductive layer after the etching.

\* \* \* \* \*